US012727149B2

(12) United States Patent
Park et al.

(10) Patent No.: US 12,727,149 B2
(45) Date of Patent: Sep. 1, 2026

(54) SEMICONDUCTOR DEVICE AND METHOD FOR FABRICATING THE SAME

(71) Applicant: SK hynix Inc., Gyeonggi-do (KR)

(72) Inventors: Hae Jung Park, Gyeonggi-do (KR); Dae Won Kim, Gyeonggi-do (KR); Young Chun Kim, Gyeonggi-do (KR); Hyun Jin Lee, Gyeonggi-do (KR); Jin Hwan Jeon, Gyeonggi-do (KR); Ri Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 493 days.

(21) Appl. No.: 18/105,245

(22) Filed: Feb. 3, 2023

(65) Prior Publication Data

US 2023/0380144 A1 Nov. 23, 2023

(30) Foreign Application Priority Data

May 17, 2022 (KR) ........................ 10-2022-0060091

(51) Int. Cl.
*H10B 12/00* (2023.01)

(52) U.S. Cl.
CPC ........... *H10B 12/482* (2023.02); *H10B 12/02* (2023.02); *H10B 12/315* (2023.02); *H10B 12/34* (2023.02); *H10B 12/485* (2023.02)

(58) Field of Classification Search
CPC .......... H01L 23/5329; H01L 23/53295; H10B 12/315; H10B 12/34; H10B 12/482; H10B 12/485
See application file for complete search history.

(56) References Cited

U.S. PATENT DOCUMENTS

| | | | | |
|---|---|---|---|---|
| 9,627,387 | B2 | 4/2017 | Jung et al. | |
| 10,847,519 | B2 * | 11/2020 | Ji | H01L 21/02126 |
| 2015/0235950 | A1 * | 8/2015 | Han | H10B 12/0335 257/773 |
| 2016/0211215 | A1 * | 7/2016 | Lee | H01L 21/76897 |
| 2018/0040561 | A1 * | 2/2018 | Kim | H01L 23/5226 |
| 2018/0350611 | A1 | 12/2018 | Kim et al. | |

(Continued)

FOREIGN PATENT DOCUMENTS

| | | |
|---|---|---|
| KR | 10-2019-0112444 A | 10/2019 |
| KR | 10-2022-0035618 A | 3/2022 |

OTHER PUBLICATIONS

Office Action for Korean Patent Application No. 10-2022-0060091 issued by the Korean Patent Office on Jun. 19, 2026.

*Primary Examiner* — Steven M Page
(74) *Attorney, Agent, or Firm* — IP & T GROUP LLP

(57) ABSTRACT

A semiconductor device includes: a semiconductor substrate; a plurality of bit line structures spaced apart from each other over the semiconductor substrate and each including a stacked structure of a bit line and a bit line hard mask; a contact pad positioned over the semiconductor substrate between the neighboring bit line structures; a contact structure including a stacked structure of a first contact formed over the contact pad and a second contact having a greater line width than the first contact; a first spacer structure interposed between the first contact and each of the bit line structures; and a second spacer structure interposed between the second contact and each of the bit line structures and having a smaller dielectric constant than the first spacer structure.

7 Claims, 29 Drawing Sheets

(56) References Cited

U.S. PATENT DOCUMENTS

| | | | | |
|---|---|---|---|---|
| 2019/0296024 | A1* | 9/2019 | Ji | H10B 12/488 |
| 2019/0296026 | A1* | 9/2019 | Ji | H01L 21/31144 |
| 2020/0203213 | A1* | 6/2020 | Yoon | H01L 21/7682 |
| 2021/0327882 | A1* | 10/2021 | Liao | H10B 12/482 |
| 2022/0059543 | A1* | 2/2022 | Mun | H10B 12/0335 |

* cited by examiner

SEMICONDUCTOR DEVICE AND METHOD FOR FABRICATING THE SAME

CROSS-REFERENCE TO RELATED APPLICATIONS

The present application claims priority of Korean Patent Application No. 10-2022-0060091, filed on May 17, 2022, which is incorporated herein by reference in its entirety.

BACKGROUND

1. Field

Various embodiments of the present invention relate generally to a semiconductor device and a method for fabricating the same and, more particularly, to a semiconductor device including a storage node contact and a method for fabricating the semiconductor device.

2. Description of the Related Art

As the degree of integration of semiconductor devices increases and their size decreases, the size of contact plugs employed in the semiconductor devices must decrease as well. However, smaller contact plugs require the formation of higher aspect ratio contact holes which presents a number of difficult challenges in the manufacturing process of the semiconductor devices.

For example, during an etching process for forming a contact hole having a high aspect ratio, mis-alignment may occur and often times the misalignment may be so large that the contact hole may not be formed properly, e.g., the contact hole may not be fully or at all opened all the way through its length.

Such contact hole defects may increase at higher aspect ratios and may deteriorate the electrical characteristics of the semiconductor device or render the semiconductor device fully defective.

SUMMARY

Various embodiments of the present invention disclosure are directed to a semiconductor device having excellent electrical characteristics, and a method for fabricating the semiconductor device.

In accordance with an embodiment of the present invention, a semiconductor device includes: a semiconductor substrate; a plurality of bit line structures spaced apart from each other over the semiconductor substrate and each including a stacked structure of a bit line and a bit line hard mask; a contact pad positioned over the semiconductor substrate between the neighboring bit line structures; a contact structure including a stacked structure of a first contact formed over the contact pad and a second contact having a greater line width than the first contact; a first spacer structure interposed between the first contact and each of the bit line structures; and a second spacer structure interposed between the second contact and each of the bit line structures and having a smaller dielectric constant than the first spacer structure.

In accordance with another embodiment of the present invention, a method for fabricating a semiconductor device includes: providing a semiconductor substrate; forming a plurality of bit line structures that are spaced apart from each other over the semiconductor substrate and each of the bit line structures including a stacked structure of a bit line and a bit line hard mask; forming a contact pad positioned over the semiconductor substrate between the neighboring bit line structures; forming a contact structure including a stacked structure of a first contact over the contact pad and a second contact having a line width which is greater than a line width of the first contact; forming a first spacer structure interposed between the first contact and each of the bit line structures; and forming a second spacer structure interposed between the second contact and each of the bit line structures and having a dielectric constant which is lower than a dielectric constant of the first spacer structure.

These and other features and advantages of the present invention should become apparent to those with ordinary skill in the art of the present invention from the detailed description of specific examples of the invention in conjunction with the following figures.

DETAILED DESCRIPTION

Figure 1:
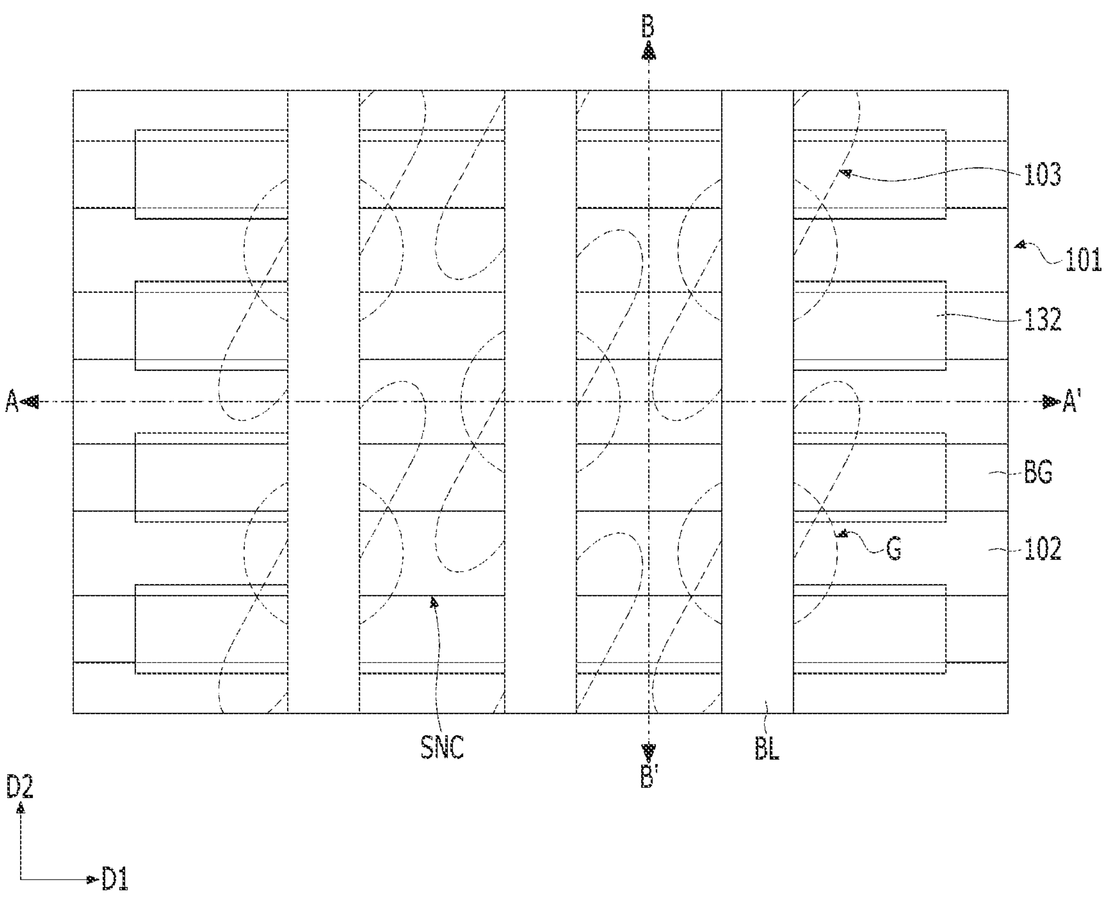
FIG. 1 is a plan view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure can be understood more thoroughly, and so that this disclosure conveys the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being “on” a second layer or “on” a substrate, it not only refers to a case where the first layer is formed directly on the second layer or the substrate but also a case where a third layer exists between the first layer and the second layer or the substrate.

Figure 2A:
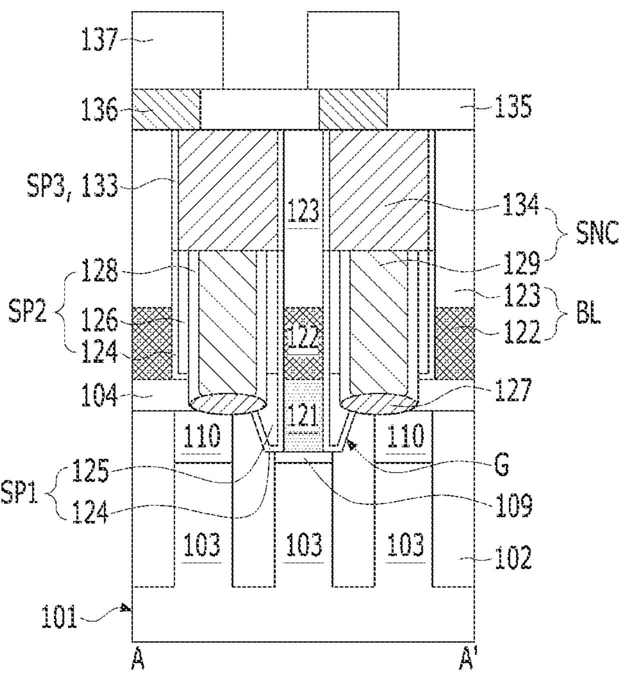
FIGS. 2A and 2B are cross-sectional views taken along line A-A' and B-B' of FIG. 1, respectively, illustrating the semiconductor device in accordance with an embodiment of the present invention.
Figure 2B:
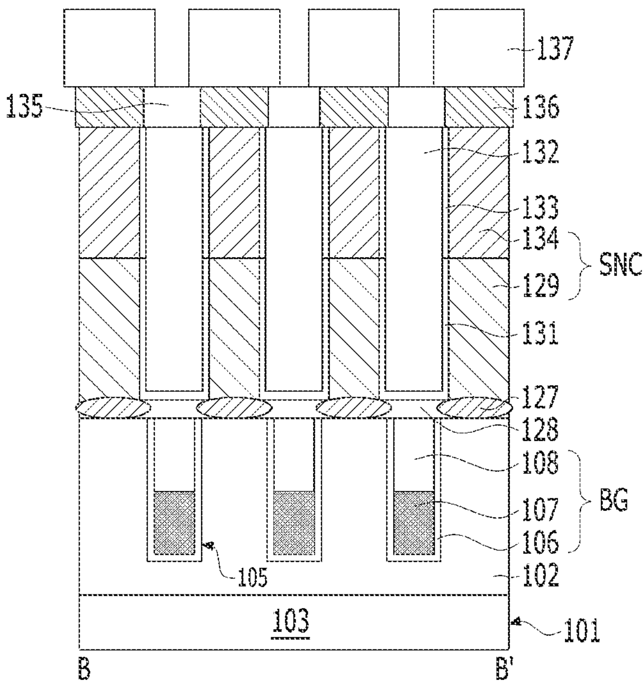

FIG. 1 is a plan view illustrating a semiconductor device in accordance with an embodiment of the present invention. FIGS. 2A and 2B are cross-sectional views taken along line A-A' and B-B' of FIG. 1, respectively, illustrating the semiconductor device in accordance with an embodiment of the present invention.

Referring to FIGS. 1, 2A and 2B, the semiconductor device may include a plurality of memory cells. Each memory cell may include a cell transistor including a buried gate structure BG, a bit line structure BL, and a memory element 137.

An isolation layer 102 and an active region 103 may be formed over a substrate 101. A plurality of active regions 103 may be defined by the isolation layer 102. Each of the active regions 103 may have a bar shape having a major axis and a minor axis. The active regions 103 may be positioned to be spaced apart from each other at a predetermined interval.

The substrate 101 may be formed of a material containing silicon. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may also include different semiconductor materials, such as germanium. The substrate 101 may include a III/V-group semiconductor substrate, for example, a compound semiconductor substrate, such as GaAs. The substrate 101 may include a Silicon-On-Insulator (SOI) substrate. The isolation layer 102 may be formed by a Shallow Trench Isolation (STI) process.

A line-shaped buried gate structure BG (refer to FIG. 1) extending in a first direction D1 may be formed in the substrate 101. The buried gate structure may include a gate dielectric layer 106 formed over the surface of the gate trench 105, a gate electrode 107 formed over the gate dielectric layer 106 to fill the gate trench 105, and a sealing layer 108.

To be specific, a line-shaped gate trench 105 crossing the active region 103 and the isolation layer 102 in the first direction D1 may be formed in the substrate 101. The gate trench 105 may be formed in a predetermined depth in a region defined by the hard mask layer 104 which is formed on the surface of the substrate 101. The bottom surface of the gate trench 105 may be positioned at a higher level than the bottom surface of the isolation layer 102. In other words, the gate trench 105 may have a shallower depth than the isolation layer 102. According to another embodiment of the present invention, the bottom portion of the gate trench 105 may have a curvature. According to yet another embodiment of the present invention, the isolation layer 102 in the direction that the gate trench 105 extends may be etched to a predetermined depth to form a fin in the active region 103.

A gate dielectric layer 106 may be formed on the surface of the gate trench 105. A gate electrode 107 partially filling the gate trench 105 may be formed over the gate dielectric layer 106. A gate sealing layer 108 may be formed over the gate electrode 107 to fill the remaining portion of the gate trench 105. The upper surface of the sealing layer 108 may be positioned at the same level as the upper surface of the hard mask layer 104. The upper surface of the gate electrode 107 may be positioned at a lower level than the upper surface of the substrate 101. The gate electrode 107 may be formed of a low-resistance metal material. The gate electrode 107 may be formed by sequentially stacking titanium nitride and tungsten. According to another embodiment of the present invention, the gate electrode 107 may be formed of titanium nitride only (TiN only).

First and second impurity regions 109 and 110 may be formed in the substrate 101. The first and second impurity regions 109 and 110 may be referred to as ‘source/drain regions’. The first and second impurity regions 109 and 110 may be spaced apart from each other by the gate trench 105. Accordingly, the gate electrode 107 and the first and second impurity regions 109 and 110 may become a cell transistor. The cell transistor may be able to improve a short channel effect that may occur due to the gate electrode 107 having a buried gate structure.

A bit line contact 121 may be formed over the substrate 101. The bit line contact 121 may be coupled to the first impurity region 109. The bit line contact 121 may be positioned in the inside of a bit line contact hole. The bit line contact hole may expose the first impurity region 109. The lower surface of the bit line contact 121 may be lower than the upper surface of the substrate 101. The bit line contact 121 may be formed of polysilicon or a metal material. A portion of the bit line contact 121 may have a line width which is smaller than a diameter of the bit line contact hole. Accordingly, gaps G may be formed on both sides of the bit line contact 121. The gaps G may be independently formed on both sides of the bit line contact 121. As a result, one bit line contact 121 and a pair of gaps G may be positioned in the bit line contact hole, and the pair of gaps G may be spaced apart by the bit line contact 121. A gap G may be positioned between the bit line contact 121 and a contact structure SNC.

A bit line structure BL (refer to FIG. 1) may be formed over the bit line contact 121. The bit line structure BL may be coupled to the active region by the bit line contact 121. The bit line structure BL may include a bit line 122 and a bit line hard mask 123 over the bit line 122. Referring to FIG. 1, the bit line structure BL may have a line shape extending in a direction crossing the buried gate structure BG, that is, a second direction D2 (refer to FIG. 1). A portion of the bit line 122 may be coupled to the bit line contact 121. Referring to FIG. 2A, the bit line 122 and the bit line contact 121 may have the same line width. Accordingly, the bit line 122 may extend in one direction while covering the upper surface of the bit line contact 121. The bit line 122 may include a metal material. The bit line hard mask 123 may include a dielectric material.

First to third spacer structures SP1, SP2, and SP3 may be formed on the sidewalls of the bit line contact 121 and the bit line structure BL. The first spacer structure SP1 may be positioned on the sidewall of the bit line contact 121. The second spacer structure SP2 may be positioned on the sidewall of the bit line 122. The third spacer structure SP3 may be positioned on the sidewall of the bit line hard mask 123. The first to third spacer structures SP1, SP2, and SP3 may have different stacked structures.

The first spacer structure SP1 may fill the gap G positioned on both sides of the bit line contact 121. The first spacer structure SP1 may include a first spacer 124 and a gap-fill spacer 125. The first spacer structure SP1 may have a stacked structure of the first spacer 124 which is conformally formed along the surface of the gap G and the gap-fill spacer 125 which fills the gap G over the first spacer 124. The first spacer 124 and the gap-fill spacer 125 may be formed of a dielectric material including silicon. For example, the first spacer 124 may include silicon oxide. For example, the gap-fill spacer 125 may include silicon nitride. According to another embodiment of the present invention, a seed layer may be interposed between the bit line contact 121 and the first spacer structure SP1. For example, the seed layer may be silicon nitride. For example, the seed layer may have a thickness of 1 Å or more and 10 Å or less.

The second spacer structure SP2 may include a stacked structure of first to third spacers 124, 126, and 128. The second spacer structure SP2 may have a structure in which the first to third spacers 124, 126, and 128 are sequentially stacked from the sidewall of the bit line 122. The first spacer 124 and the second spacer may be formed of a dielectric material including silicon. For example, the first spacer 124 may include silicon oxide. For example, the second spacer 126 may include silicon oxide. For example, the third spacer 128 may include a low-k material. In other words, the second spacer structure SP2 may have an O/O/K (Oxide/Oxide/Low-k) structure. According to another embodiment of the present invention, a seed layer may be interposed between the bit line 122 and the second spacer structure SP2. For example, the seed layer may be silicon nitride. For example, the seed layer may have a thickness of 1 Å or more and 10 Å or less. The seed layer of the second spacer structure SP2 may be a single layer formed simultaneously with the second spacer structure SP2.

The first spacer 124 of the second spacer structure SP2 may be a single layer which is formed simultaneously with the first spacer 124 of the first spacer structure SP1. The first spacer 124 of the second spacer structure SP2 may be formed on the same layer as the first spacer 124 of the first spacer structure SP1. In other words, the first spacer 124 of the second spacer structure SP2 may extend from the first spacer 124 of the first spacer structure SP1 in a direction perpendicular to the surface of the substrate 101.

The upper surface of the second spacer structure SP2 may be positioned at a higher level than the upper surface of the bit line 122. According to another embodiment of the present invention, the upper surface of the second spacer structure SP2 may be positioned at the same level as the upper surface of the bit line 122.

The third spacer structure SP3 may include a fourth spacer 133. For example, the fourth spacer 133 may include silicon nitride.

The third spacer structure SP3 may be positioned on the sidewall of the bit line hard mask 123. The lower surface of the third spacer structure SP3 may be positioned at a higher level than the upper surface of the bit line 122. The upper surface of the third spacer structure SP3 may be positioned at the same level as the upper surface of the bit line hard mask 123.

Referring to FIG. 1, neighboring contact structures SNC positioned to be spaced apart from each other in the second direction D2 and may be spaced apart by plug isolation layers 132. The plug isolation layers 132 may include a dielectric material. The plug isolation layers 132 may include silicon nitride.

A contact pad 127 may be positioned between the contact structure SNC and the second source/drain region 110. The contact pad 127 may serve to couple the contact structure SNC and the second source/drain region 110 to each other. The contact pad 127 may be formed by Selective Epitaxial Growth (SEG). The contact pad 127 may be formed by self-aligning.

The contact pad 127 may be formed by a bottom-up growth process, for example, such as an epitaxial growth process, a selective epitaxial growth process, and the like. The contact pad 127 may include a silicon-containing epitaxial layer. For example, the contact pad 127 may include a silicon epitaxial layer. The contact pad 127 may include SEG Si.

The contact pad 127 may include a dopant. Accordingly, the contact pad 127 may be a doped epitaxial layer. The dopant may include an N-type dopant. The N-type dopant may include phosphorus (P), arsenic (As), antimony (Sb), or a combination thereof. The contact pad 127 may include a silicon epitaxial layer which is doped with phosphorus formed by selective epitaxial growth, that is, heavily doped SEG silicon phosphide (SiP) or a combination thereof. Here, the terms low-concentration SEG SiP and high-concentration SEG SiP, refer to low concentration and high concentration of the phosphorus in the SEG SiP, individually.

According to another embodiment of the present invention, the contact pad 127 may include SEG SiGe which is doped with an N-type dopant or SEG SiC which is doped with an N-type dopant.

A contact structure SNC may be formed over the contact pad 127. The contact structure SNC may be formed between the neighboring bit line structures BL. The contact structure SNC may be coupled to the second source/drain region 110 by the contact pad 127. The contact structure SNC may include a stacked structure of a first contact 129 and a second contact 134. The first contact 129 and the second contact 134 may include a conductive material. For example, the first contact 129 may include polysilicon. The second contact 134 may include a metal material. For example, the second contact 134 may include any one selected from titanium, titanium nitride, and tungsten, or a combination thereof.

The upper surface of the first contact 129 may be positioned at a higher level than the upper surface of the bit line 122. The upper surface of the first contact 129 may be positioned at the same level as the upper surface of the second spacer structure SP2. The upper surface of the second contact 134 may be positioned at the same level as the upper surface of the third spacer structure SP3. In other words, the second spacer structure SP2 having an O/O/K structure may be positioned between the first contact 129 and the bit line 122. Accordingly, the parasitic capacitance between the first contact 129 and the bit line 122 may be minimized.

The third spacer structure SP3 may be positioned between the second contact 134 and the bit line hard mask 123. The third spacer structure SP3 may be formed as a single layer of the fourth spacer 133 to be thinner than the second spacer structure SP3. In other words, the line width of the second contact 134 may be greater than the line width of the first contact 129. Accordingly, an overlay margin between the contact structure SNC and a landing pad 136 may be secured, and contact resistance may be reduced.

The landing pad 136 may be formed over the contact structure SNC. The neighboring landing pads 136 may be spaced apart by an inter-layer dielectric layer 135. The landing pad 136 may be a structure for interconnection between the contact structure SNC and a memory element 137. The landing pad 136 may include a conductive material.

The memory element 137 may be formed over the landing pad 136. The memory element 137 may include a capacitor including a storage node. The storage node may include a pillar type. A dielectric layer and a plate node may be further formed over the storage node. The storage node may have a form of a cylinder other than a form of a pillar. The storage node may be coupled to the contact structure SNC through the landing pad 136.

According to another embodiment of the present invention, diverse types of memory elements may be coupled over the contact structure SNC.

As described above, according to an embodiment of the present invention, parasitic capacitance with the first contact 129 may be minimized by disposing the second spacer structure SP2 having an O/O/K structure on the sidewall of the bit line 122. Also, it is possible to secure an overlay margin between the contact structure SNC and the landing pad 136 and to reduce contact resistance by disposing the third spacer structure SP3 formed of a single layer on the sidewall of the bit line hard mask 123 that is formed of a dielectric material and thus does not affect the parasitic capacitance.

FIGS. 3 to 20 illustrate a method for fabricating a semiconductor device. FIGS. 3A, 4A, 5A, 6A, 7A, 8A, 9A, 10A, 11A, 12A, 13A, 14A, 15A, 16A, 17A, 18A, 19A, and 20A are plan views. FIGS. 3B, 4B, 5B, 6B, 7B, 8B, 9B, 10B, 11B, 12B, 13B, 14B, 15B, 16B, 17B, 18B, 19B, and 20B are cross-sectional views taken along a line A-A' respectively shown in FIGS. 3A, 4A, 5A, 6A, 7A, 8A, 9A, 10A, 11A, 12A, 13A, 14A, 15A, 16A, 17A, 18A, 19A, and 20A. FIGS. 3C, 4C, 5C, 6C, 7C, 8C, 9C, 10C, 11C, 12C, 13C, 14C, 15C, 16C, 17C, 18C, 19C, and 20C are cross-sectional views taken along a line B-B' respectively shown in FIGS. 3A, 4A, 5A, 6A, 7A, 8A, 9A, 10A, 11A, 12A, 13A, 14A, 15A, 16A, 17A, 18A, 19A, and 20A.

Figure 3A:
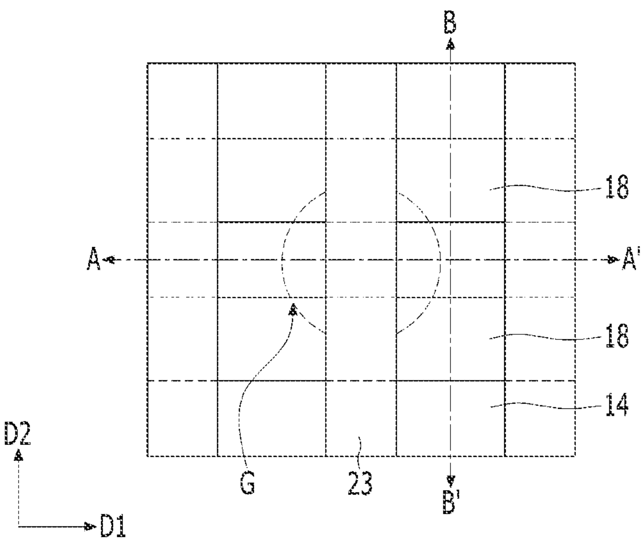
FIGS. 3A, 3B, and 3C illustrate a method for fabricating a semiconductor device in accordance with an embodiment of the present invention.
Figure 3B:
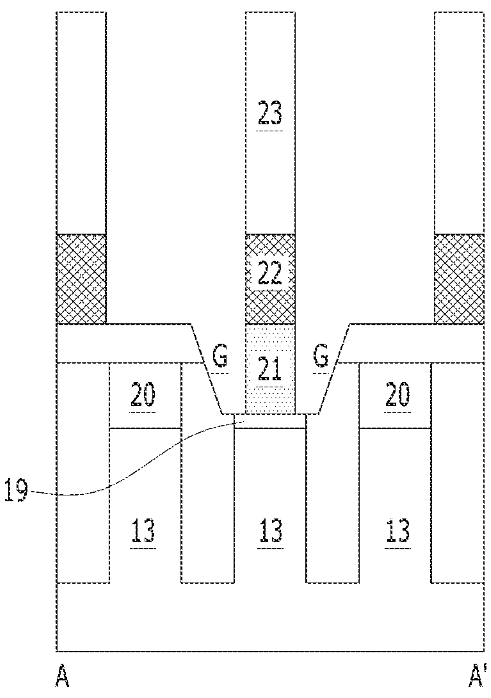
Figure 3C:
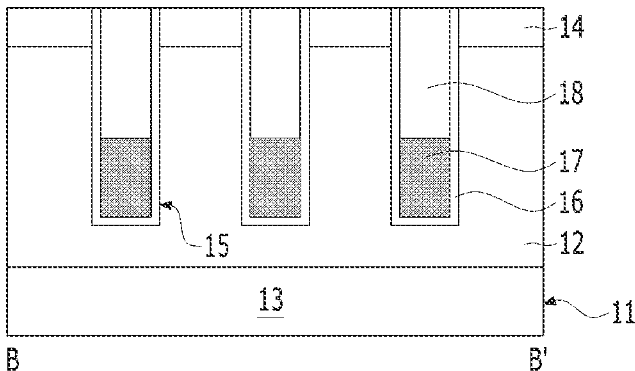

Referring to FIGS. 3A to 3C, an isolation layer 12 may be formed in the substrate 11. The active regions 13 may be defined by the isolation layer 12. Each of the active regions 13 may have an elongated bar shape. The active regions 13 may be spaced apart from each other at a predetermined interval.

The isolation layer 12 may be formed by a Shallow Trench Isolation (STI) process. The STI process may include etching the substrate 11 to form an isolation trench (reference numeral omitted) and the isolation trench may be filled with a dielectric material, thereby forming the isolation layer 12. The isolation layer 12 may include silicon oxide, silicon nitride, or a combination thereof. Chemical vapor deposition (CVD) or other deposition processes may be performed to fill the isolation trench with the dielectric material. A planarization process such as Chemical Mechanical Polishing (CMP) may additionally be used.

Subsequently, a buried gate structure may be formed in the substrate 11. The buried gate structure may include a gate trench 15, a gate dielectric layer 16 covering the bottom surface and sidewalls of the gate trench 15, a gate electrode 17 partially filling the gate trench 15 over the gate dielectric layer 16, and a sealing layer 18 formed over the gate electrode 17.

A method for forming the buried gate structure may be as follows.

First, a gate trench 15 may be formed in the substrate 11. The gate trench 15 may have a line shape crossing the active region 13 and the isolation layer 12. The gate trench 15 may be formed by forming a mask pattern over the substrate 11 and performing an etching process using the mask pattern as an etch mask. In order to form the gate trench 15, a hard mask layer 14 may be used as an etch barrier. The hard mask layer 14 may include tetraethyl orthosilicate (TEOS). The gate trench 15 may be formed to be shallower than the isolation trench. In other words, the bottom surface of the gate trench 15 may be positioned at a higher level than the bottom surface of the isolation layer 12. The gate trench 15 may have a sufficient depth to be increased as much as the average cross-sectional area of the gate electrode 17. Accordingly, the resistance of the gate electrode 17 may be reduced. According to another embodiment of the present invention, the bottom corners of the gate trench 15 may have a curvature. By forming the bottom corners of the gate trench 15 to have a curvature, irregularities at the bottom of the gate trench 15 may be minimized, and thus the filling of the gate electrode 17 may be easily performed.

After the gate trench 15 is formed, a fin region may be formed. The fin region may be formed by recessing a portion of the isolation layer 12.

Subsequently, a gate dielectric layer 16 may be formed on the bottom surface and sidewalls of the gate trench 15. Before the gate dielectric layer 16 is formed, etch damage on the surface of the gate trench 15 may be cured. For example, after a sacrificial oxide is formed by a thermal oxidation process, the sacrificial oxide may be removed.

The gate dielectric layer 16 may be formed by a thermal oxidation process. For example, the gate dielectric layer 16 may be formed by oxidizing the bottom surface and sidewalls of the gate trench 15.

According to another embodiment of the present invention, the gate dielectric layer 16 may be formed by a deposition method, such as Chemical Vapor Deposition (CVD) or Atomic Layer Deposition (ALD). The gate dielectric layer 16 may include a high-k material, an oxide, a nitride, an oxynitride, or a combination thereof. The high-k material may include a hafnium-containing material. The hafnium-containing material may include hafnium oxide, hafnium silicon oxide, hafnium silicon oxynitride, or a combination thereof. According to another embodiment of the present invention, the high-k material may include lanthanum oxide, lanthanum aluminum oxide, zirconium oxide, zirconium silicon oxide, zirconium silicon oxynitride, aluminum oxide, and combinations thereof. As for the high-k material, other known high-k materials may be selectively used.

According to another embodiment of the present invention, the gate dielectric layer 16 may be formed by depositing a liner polysilicon layer and then radically oxidizing the liner polysilicon layer.

Also, according to another embodiment of the present invention, the gate dielectric layer 16 may be formed by forming a liner silicon nitride layer and then radically oxidizing the liner silicon nitride layer.

Subsequently, a gate electrode 17 may be formed over the gate dielectric layer 16. In order to form the gate electrode 17, a recessing process may be performed after a conductive layer is formed to fill the gate trench 15. The recessing process may be performed as an etch-back process or as a CMP process and an etch-back process are sequentially performed. The gate electrode 17 may have a recessed shape that partially fills the gate trench 15. In other words, the upper surface of the gate electrode 17 may be positioned at a lower level than the upper surface of the substrate 11. The gate electrode 17 may include a metal, a metal nitride, or a combination thereof. For example, the gate electrode 17 may be formed of titanium nitride (TiN), tungsten (W), or titanium nitride/tungsten (TiN/W). Titanium nitride/tungsten (TiN/W) may have a structure in which titanium nitride is conformally formed and then the gate trench 15 is partially filled with tungsten. As for the gate electrode 17, titanium nitride may be used alone, and this may be referred to as the gate electrode 17 having a "TiN Only" structure.

Subsequently, a sealing layer 18 may be formed over the gate electrode 17. The sealing layer 18 may include a dielectric material. The remaining portion of the gate trench 15 over the gate electrode 17 may be filled with the sealing layer 18. The sealing layer 18 may include silicon oxide. Also, according to another embodiment of the present invention, the sealing layer 18 may be of a NON (Nitride-Oxide-Nitride) structure. The upper surface of the sealing layer 18 may be positioned at the same level as the upper surface of the hard mask layer 14. To this end, when the sealing layer 18 is formed, a Chemical Mechanical Polishing (CMP) process using the upper surface of the hard mask layer 14 as an etch stop target may be performed.

After the formation of the buried gate structure as described above, a first source/drain region 19 and a second source/drain region 20 may be formed. The first source/drain region 19 and the second source/drain region 20 may be formed by a doping process such as implantation. The first source/drain region 19 and the second source/drain region 20 may have the same depth. According to another embodiment of the present invention, the first source/drain region 19 may be deeper than the second source/drain region 20. The first source/drain region 19 may be a region to which a bit line contact is to be coupled. The second source/drain region 20 may be a region to which a storage contact is to be coupled.

A cell transistor of a memory cell may be formed by the gate electrode 17, the first source/drain region 19, and the second source/drain region 20.

Subsequently, a bit line structure that is coupled to the first source/drain region 19 may be formed. The bit line structure may include a stacked structure of a bit line 22 and a bit line hard mask 23.

A method for forming the bit line structure may be as follows.

First, the hard mask layer 14 may be etched to form a bit line contact hole. The bit line contact hole may have a circular shape when viewed from the perspective of a plan view. The bit line contact hole may have an elliptical shape when viewed from the perspective of a plan view. A portion of the substrate 11 may be exposed through the bit line contact hole. The bit line contact hole may have a diameter which is controlled to have a predetermined line width. The bit line contact hole may be formed to expose a portion of the active region 13. For example, the first source/drain region 19 may be exposed by the bit line contact hole. The bit line contact hole may have a diameter which is larger than the width of the minor axis of the active region 13. As a result, in the etching process for forming the bit line contact hole, a portion of the first source/drain region 19, the isolation layer 12, and the sealing layer 18 may be etched. In other words, the sealing layer 18, the first source/drain region 19 and the isolation layer 12 below the bit line contact hole may be recessed to a predetermined depth. Accordingly, the bottom portion of the bit line contact hole may be expanded into the substrate 11. As the bit line contact hole expands, the first source/drain region 19 may be recessed, and the upper surface of the first source/drain region 19 may be positioned at a lower level than the upper surface of the second source/drain region 20.

Subsequently, a preliminary plug gap-filling the bit line contact hole may be formed. The preliminary plug may be formed by Selective Epitaxial Growth (SEG). For example, the preliminary plug may include SEG SiP. In this way, it is possible to form a preliminary plug without voids by the selective epitaxial growth. According to another embodiment of the present invention, the preliminary plug may be formed by depositing polysilicon and performing a CMP process. The preliminary plugs may fill the bit line contact holes. The upper surface of the preliminary plug may be positioned at the same level as the upper surface of the hard mask layer 14.

Subsequently, a conductive layer and a hard mask material layer may be stacked over the hard mask layer 14 including the preliminary plug. The conductive layer and the hard mask material layer may be sequentially stacked over the preliminary plug and the hard mask layer 14. The conductive layer may include a metal-containing material. The conductive layer may include a metal, a metal nitride, a metal silicide, or a combination thereof. According to an embodiment of the present invention, the conductive layer may include tungsten (W). According to another embodiment of the present invention, the conductive layer may include a stack (TiN/W) of titanium nitride and tungsten. Herein, the titanium nitride may serve as a barrier. The hard mask material layer may be formed of a dielectric material having an etch selectivity with respect to the conductive layer and the preliminary plug. The hard mask material layer may include silicon oxide or silicon nitride.

Subsequently, a bit line mask layer may be formed over the hard mask material layer. The bit line mask layer may be formed of a material having an etch selectivity with respect to the conductive layer and the hard mask material layer. The bit line mask layer may include a photoresist pattern. The bit line mask layer may be formed by a patterning method such as spacer patterning technology (SPT) or double patterning technology (DPT). When viewed from the perspective of a plan view, the bit line mask layer may have a line shape extending in the second direction D2.

Subsequently, the hard mask material layer, the conductive layer, and the preliminary plug may be etched sequentially. As a result, a bit line contact 21, a bit line 22, and a bit line hard mask 23 may be formed. The stacked structure of the bit line 22 and the bit line hard mask 23 may be referred to as a 'bit line structure'.

The line width of the bit line structure may be smaller than the diameter of the bit line contact hole. As a result, a gap G may be formed around the bit line contact 21. The gap G may not be formed in a shape surrounding the bit line contact 21, but formed independently on both sidewalls of the bit line contact 21. As a result, one bit line contact 21 and a pair of gaps G may be positioned in the bit line contact hole, and the pair of gaps G may be separated by the bit line contact 21. The bottom surface of the gap G may be positioned at the same level as the recessed upper surface of the first source/drain region 19. According to another embodiment of the present invention, the bottom surface of the gap G may extend into the inside of the isolation layer 12. In other words, the bottom surface of the gap G may be positioned at a lower level than the recessed upper surface of the first source/drain region 19.

Figure 4A:
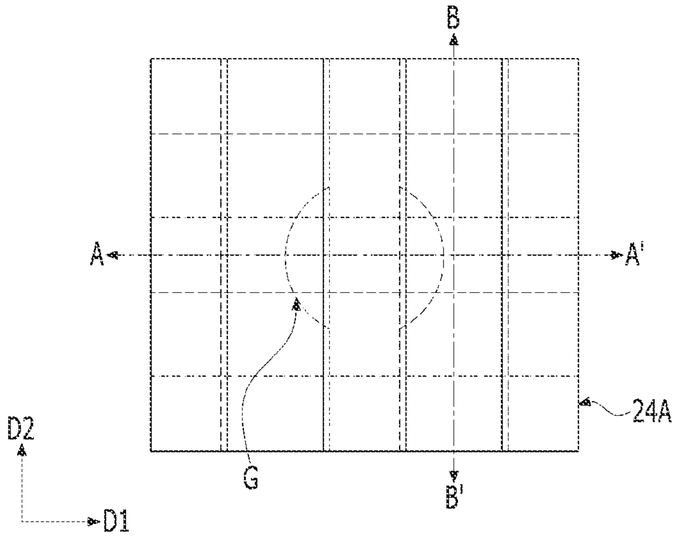
FIGS. 4A, 4B, and 4C illustrate a method for fabricating a semiconductor device in accordance with an embodiment of the present invention.
Figure 4B:
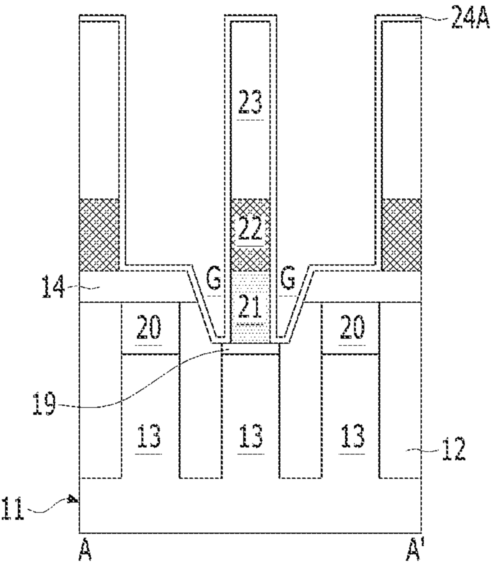
Figure 4C:
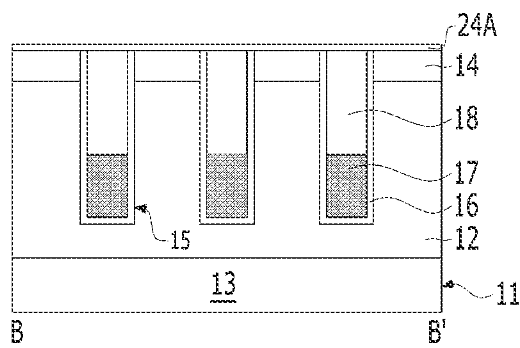

Referring to FIGS. 4A to 4C, a first spacer layer 24A may be formed. The first spacer layer 24A may be conformally formed along the entire surface profile including the bit line structure. The first spacer layer 24A may include a dielectric material. The first spacer layer 24A may include a low-k material. Here, the low-k material may refer to a material having a higher dielectric constant than silicon oxide and a lower dielectric constant than silicon nitride. The low-k material may include a material having less loss to a wet chemical than silicon oxide. For example, the first spacer layer 24A may include SiCO.

According to another embodiment of the present invention, before the forming of the first spacer layer 24A, a seed layer may be formed along the entire surface profile including the bit line structure. A seed layer may be applied to prevent oxidation of the bit line 22. For example, the seed layer may include silicon nitride. For example, the seed layer may be formed to have a thickness of 1 Å or more and 10 Å or less.

Figure 5A:
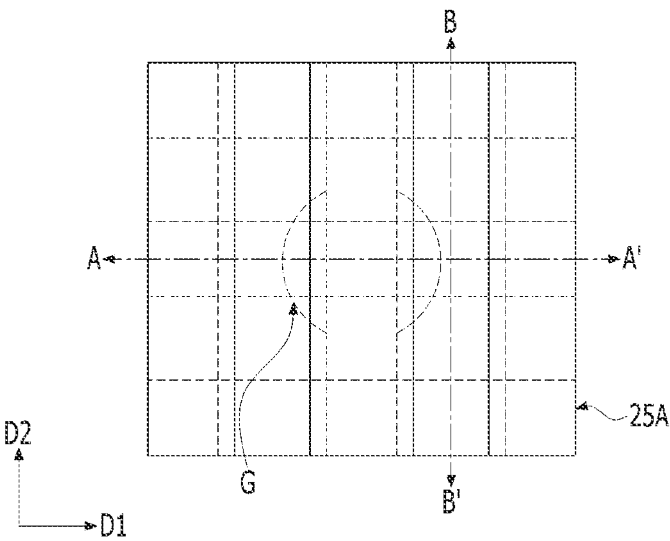
FIGS. 5A, 5B, and 5C illustrate a method for fabricating a semiconductor device in accordance with an embodiment of the present invention.
Figure 5B:
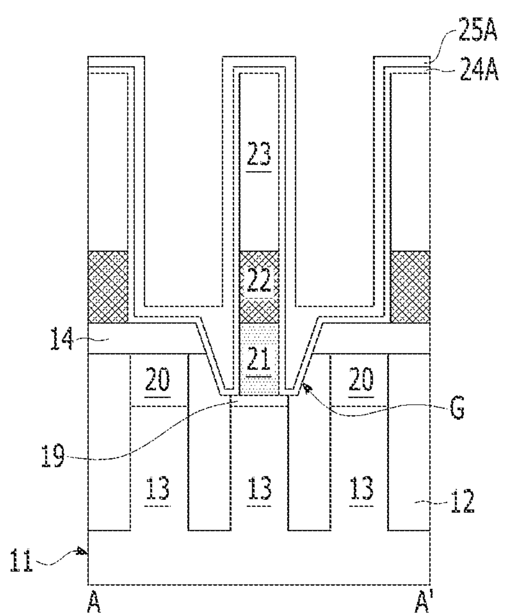
Figure 5C:
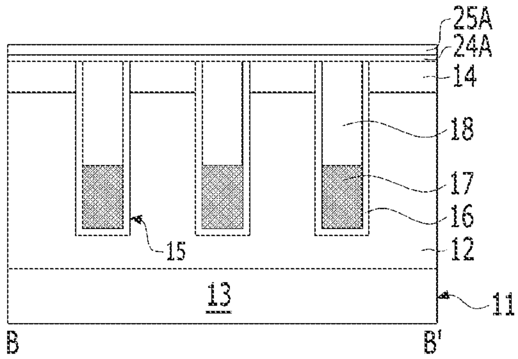

Referring to FIGS. 5A to 5C, a gap-fill spacer layer 25A may be formed over the first spacer layer 24A. The gap-fill spacer layer 25A may be formed to have a thickness that fills the gaps G on both sides of the bit line contact 21. The gap-fill spacer layer 25A may include a dielectric material. For example, the gap-fill spacer layer 25A may include silicon nitride.

Figure 6A:
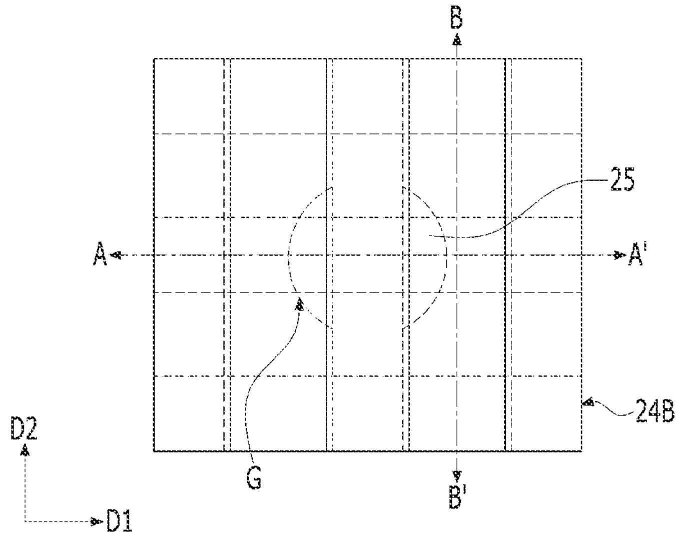
FIGS. 6A, 6B, and 6C illustrate a method for fabricating a semiconductor device in accordance with an embodiment of the present invention.
Figure 6B:
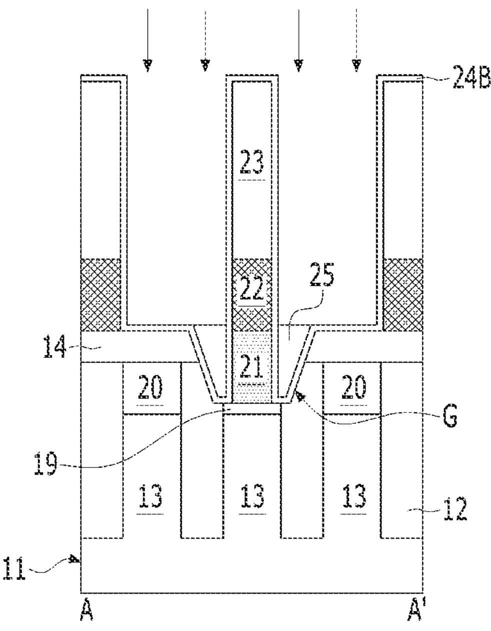
Figure 6C:
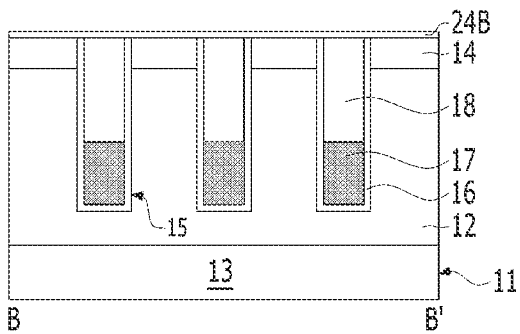

Referring to FIGS. 6A to 6C, a gap-fill spacer 25 filling the gap G may be formed. To this end, a trimming process may be performed onto the gap-fill spacer layer 25A. Accordingly, all of the gap-fill spacer layer 25A over the first spacer layer 24A except for the gap G may be removed.

Subsequently, a cleaning process may be performed. During the cleaning process, the thickness of the spacer may be maintained by forming the first spacer layer 24A of a low-k material that has less loss to wet chemicals than silicon oxide.

Subsequently, an oxygen ($O_2$) plasma strip process may be performed. The first spacer layer 24A (see FIG. 5B) formed of a low-k material may be replaced with the first spacer layer 24B formed of silicon oxide by the oxygen plasma stripping process. Accordingly, the dielectric constant of the spacer may be further reduced while maintaining the spacer thickness.

Figure 7A:
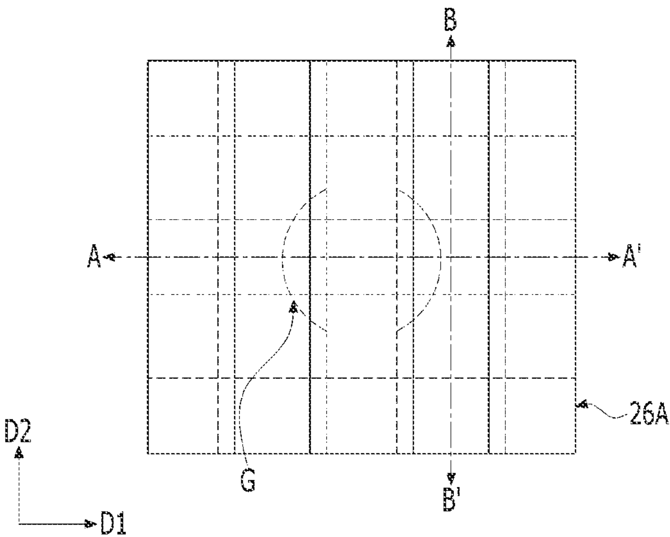
FIGS. 7A, 7B, and 7C illustrate a method for fabricating a semiconductor device in accordance with an embodiment of the present invention.
Figure 7B:
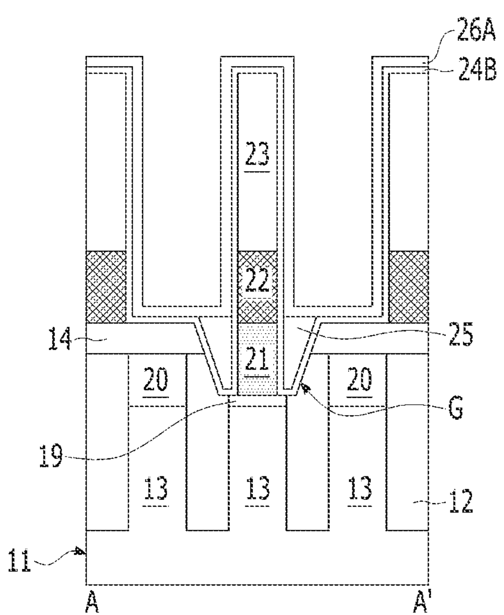
Figure 7C:
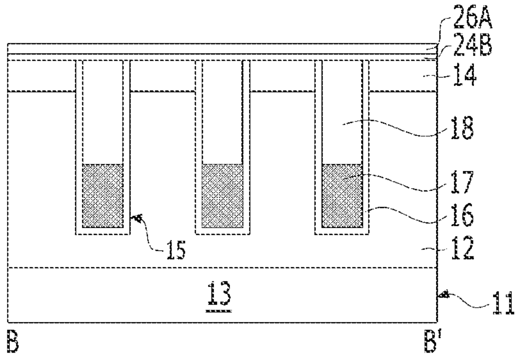

Referring to FIGS. 7A to 7C, a second spacer layer 26A may be formed over the first spacer layer 24B and the gap-fill spacer 25. The second spacer layer 26A may be conformally formed along the entire surface profile including the first spacer layer 24B. The second spacer layer 26A may include a dielectric material. The second spacer layer 26A may include a low-k material. Here, the low-k material may refer to a material having a higher dielectric constant than silicon oxide and a lower dielectric constant than silicon nitride. The low-k material may include a material having less loss to a wet chemical than silicon oxide. For example, the second spacer layer 26A may include SiCO.

Figure 8A:
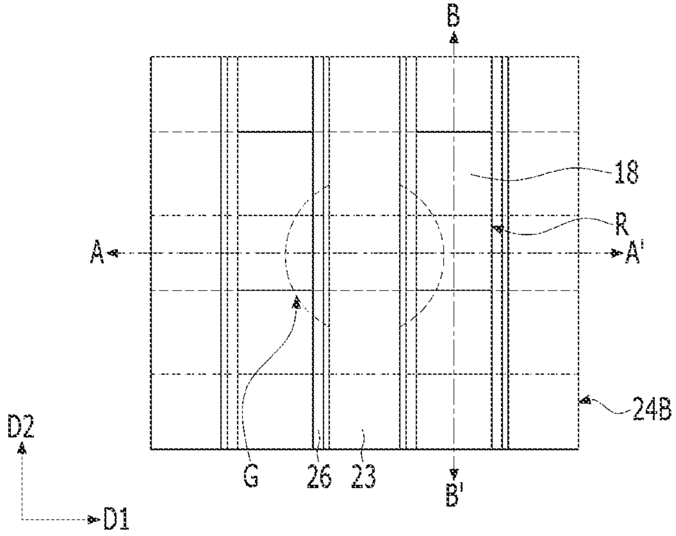
FIGS. 8A, 8B, and 8C illustrate a method for fabricating a semiconductor device in accordance with an embodiment of the present invention.
Figure 8B:
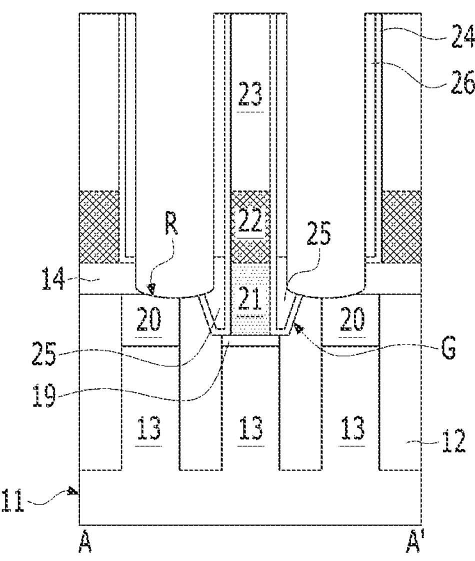
Figure 8C:
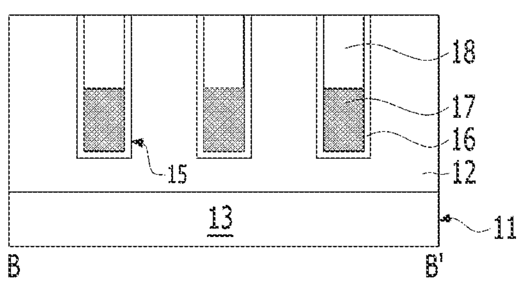

Referring to FIGS. 8A to 8C, first and second spacers 24 and 26 may be formed. To this end, the first and second spacer layers 24B and 26A may be etched. As a result, the bit line hard mask 23 and the hard mask layer 14 may be exposed.

Subsequently, the exposed hard mask layer 14 may be etched to form a recess R that exposes a portion of the active region 13. To form the recess R, the hard mask layer 14, the isolation layer 12, and the second source/drain region 20 may be etched to a predetermined depth. The recess R may extend into the inside of the substrate 11. The bottom surface of the recess R may be positioned at a lower level than the upper surface of the bit line contact 22. The bottom surface of the recess R may be positioned at a higher level than the bottom surface of the bit line contact 22.

As the first and second spacers 24 and 26 and the recess R are formed, the storage contact region may be exposed. The first and second spacers 24 and 26 may be formed on the sidewalls of a line-shape bit line structure that extends in the second direction D2. Accordingly, the regions exposed by the first and second spacers 24 and 26 and the recesses R may be regions of a line shape that are spaced apart by the bit line structure and extend in the second direction D2.

Figure 9A:
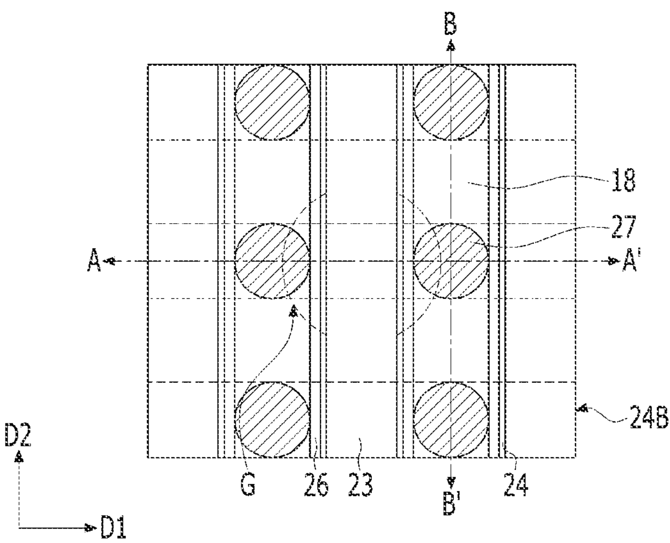
FIGS. 9A, 9B, and 9C illustrate a method for fabricating a semiconductor device in accordance with an embodiment of the present invention.
Figure 9B:
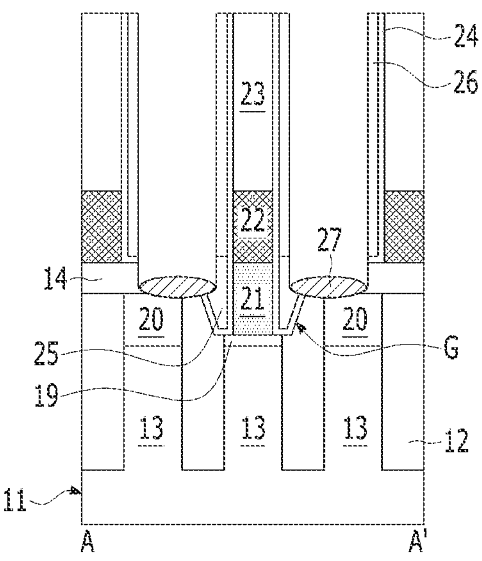
Figure 9C:
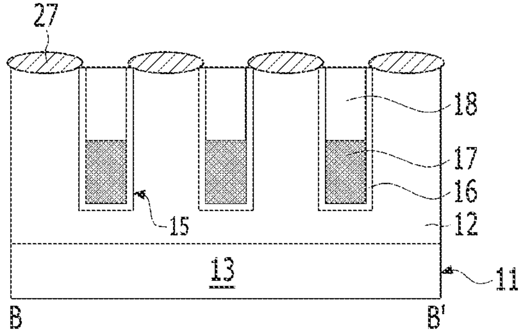

Referring to FIGS. 9A to 9C, a contact pad 27 partially filling the recess R may be formed. The contact pad 27 may be formed by a bottom-up growth process. The contact pad 27 may be formed by selective epitaxial growth (SEG). The contact pad 27 may be grown using the second source/drain region 20 as a seed. In other words, the contact pad 27 may be a self-aligning SEG. The contact pad 27 may include a silicon-containing material. The contact pad 27 may be an epitaxial layer. The pad 27 may be a silicon-containing epitaxial layer. The contact pad 27 may include SEG Si, SEG SiGe, or SEG SiC. According to another embodiment of the present invention, the contact pad 27 may include SEG Si which is doped with an N-type dopant, SEG SiGe which is doped with an N-type dopant, or SEG SiG which is doped with an N-type dopant. For example, the contact pad 27 may include SEG SiP. The contact pad 27 may be formed using a silicon source gas and an additive gas. The silicon source gas may include silane ($SiH_4$), dichlorosilane ($SiH_2Cl_2$, DCS), or a mixture thereof. The additive gas may include HCl.

The upper surface of the contact pad 27 may be positioned at a lower level than the upper surface of the bit line contact 21.

As described above, since selective epitaxial growth is performed to form the contact pad 27, the process may be simplified. Also, since the contact pad 27 is formed of a self-aligned SEG which is grown using the second source/drain region 20 as a seed, a patterning process may be omitted.

Figure 10A:
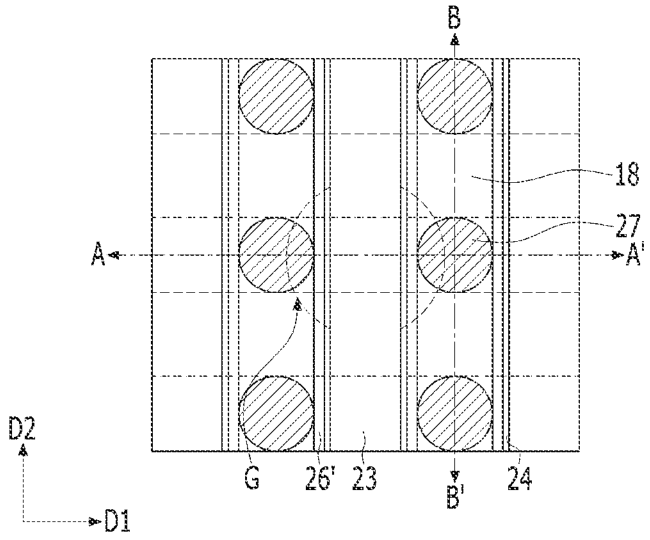
FIGS. 10A, 10B, and 10C illustrate a method for fabricating a semiconductor device in accordance with an embodiment of the present invention.
Figure 10B:
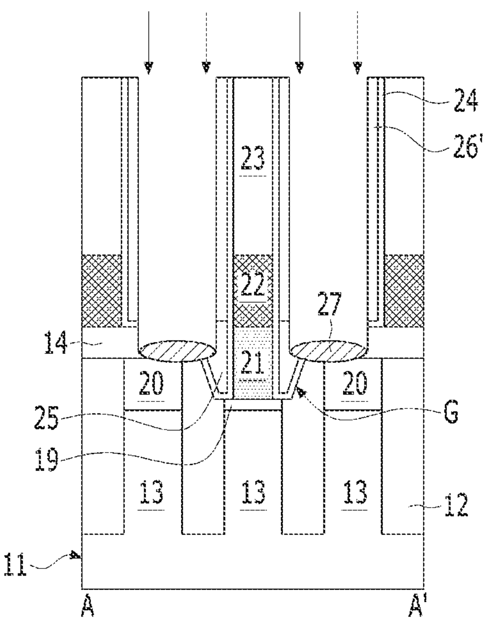
Figure 10C:
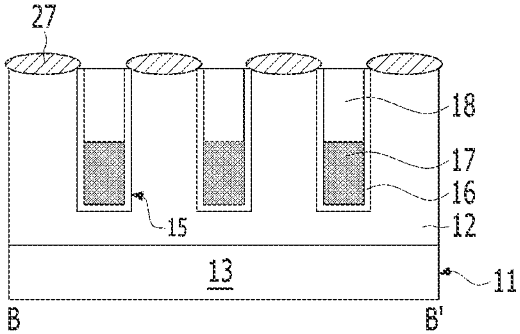

Referring to FIGS. 10A to 10C, an oxygen plasma strip process may be performed. By the oxygen plasma stripping process, the second spacers 26 (see FIG. 9B) formed of a low-k material may be replaced with the second spacers 26' formed of silicon oxide. Accordingly, the dielectric constant of the spacer may be further decreased while maintaining the spacer thickness.

Figure 11A:
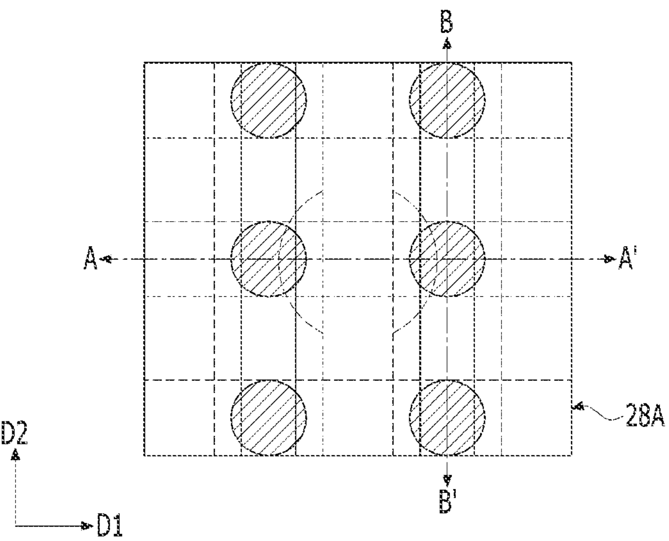
FIGS. 11A, 11B, and 11C illustrate a method for fabricating a semiconductor device in accordance with an embodiment of the present invention.
Figure 11B:
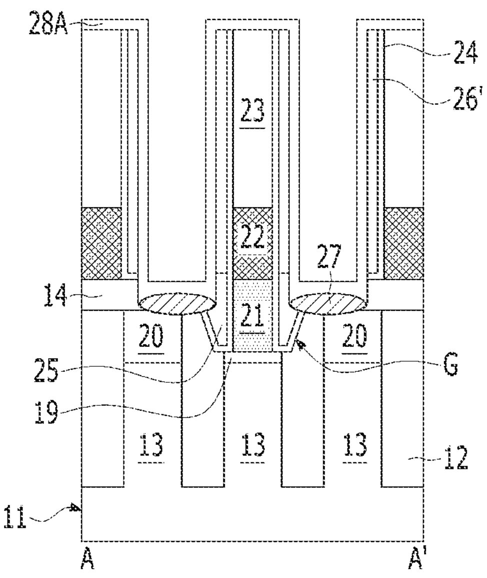
Figure 11C:
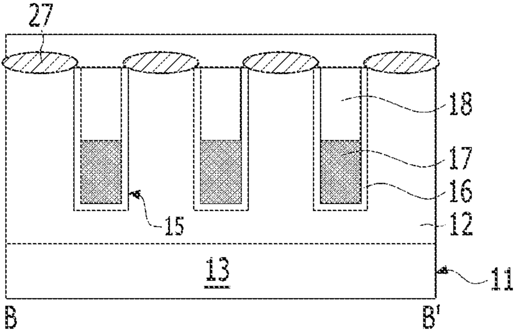

Referring to FIGS. 11A to 11C, a third spacer layer 28A may be formed over the second spacer 26' and the contact pad 27. The third spacer layer 28A may be conformally formed along the entire surface profile including the second spacer 26'. The third spacer layer 28A may include a dielectric material. The third spacer layer 28A may include a low-k material. Here, the low-k material may refer to a material having a higher dielectric constant than silicon oxide and a lower dielectric constant than silicon nitride. The low-k material may include a material having less loss to a wet chemical than silicon oxide. For example, the third spacer layer 28A may include SiCO.

Figure 12A:
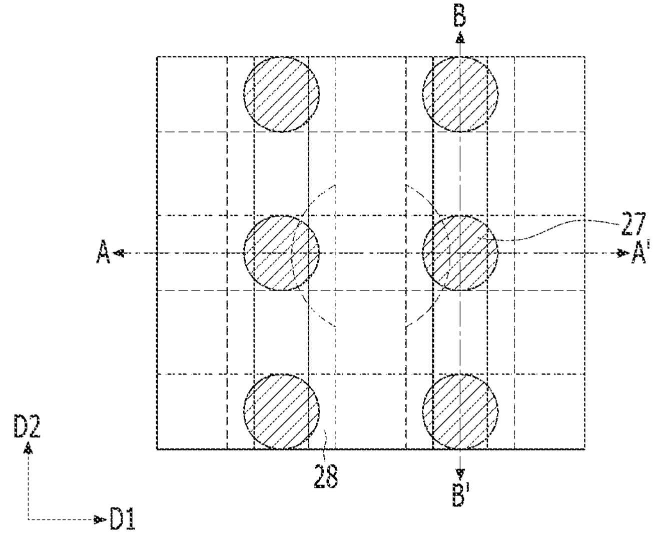
FIGS. 12A, 12B, and 12C illustrate a method for fabricating a semiconductor device in accordance with an embodiment of the present invention.
Figure 12B:
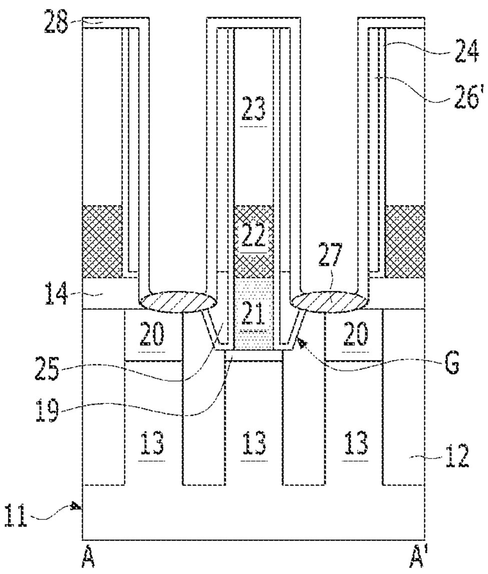
Figure 12C:
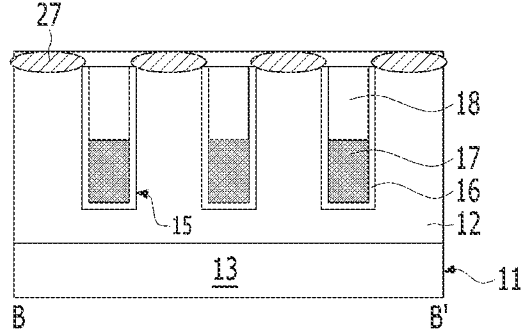

Referring to FIGS. 12A to 12C, a third spacer 28 exposing the contact pad 27 may be formed. The third spacer 28 may be formed by etching the third spacer layer 28A over the contact pad 27.

Figure 13A:
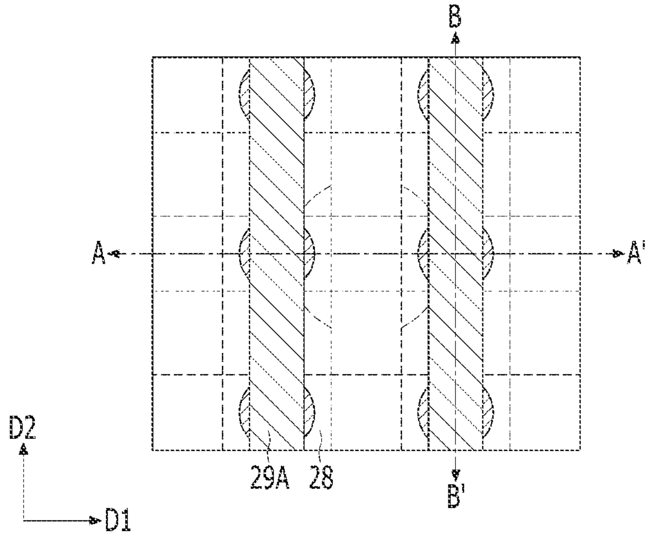
FIGS. 13A, 13B, and 13C illustrate a method for fabricating a semiconductor device in accordance with an embodiment of the present invention.
Figure 13B:
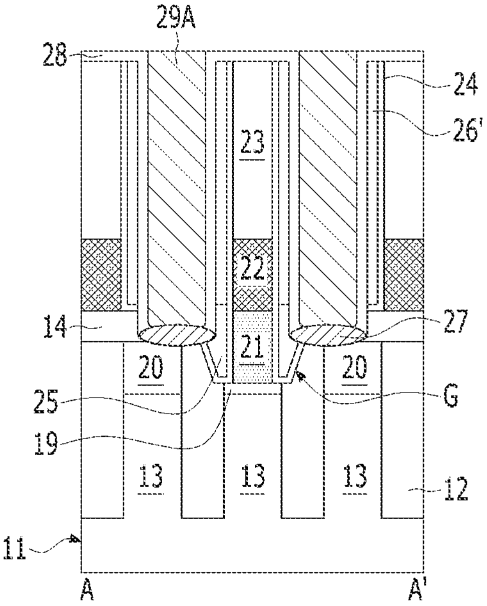
Figure 13C:
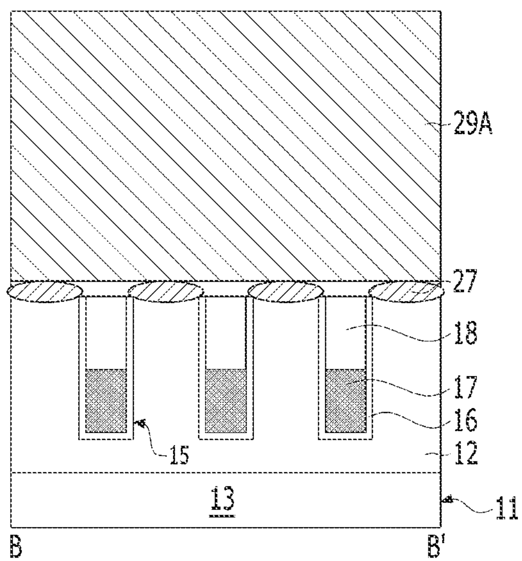

Referring to FIGS. 13A to 13C, a plug material layer 29A that gap-fills the storage contact region may be formed. The plug material layer 29A may be formed to gap-fill all of the line-shape storage contact regions that are exposed by the bit line structure. The plug material layer 29A may include a conductive material. For example, the plug material layer 29A may include polysilicon.

Figure 14A:
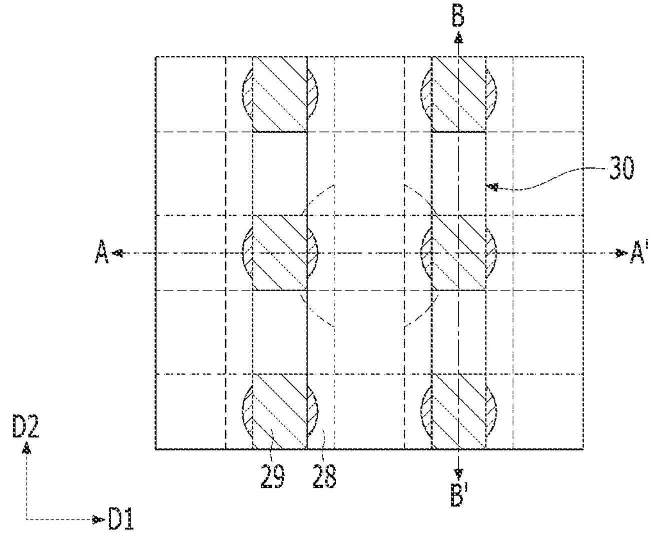
FIGS. 14A, 14B, and 14C illustrate a method for fabricating a semiconductor device in accordance with an embodiment of the present invention.
Figure 14B:
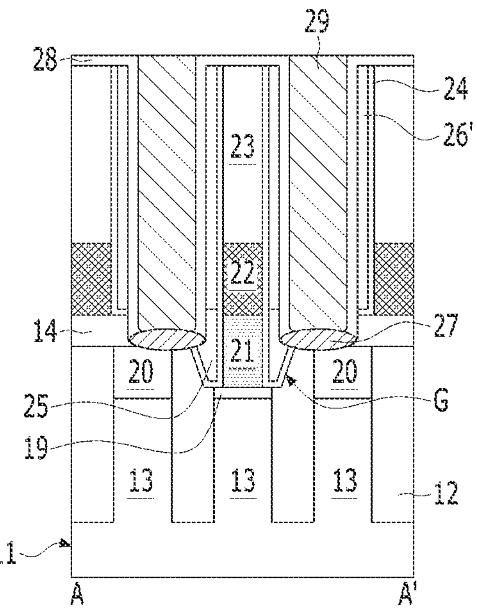
Figure 14C:
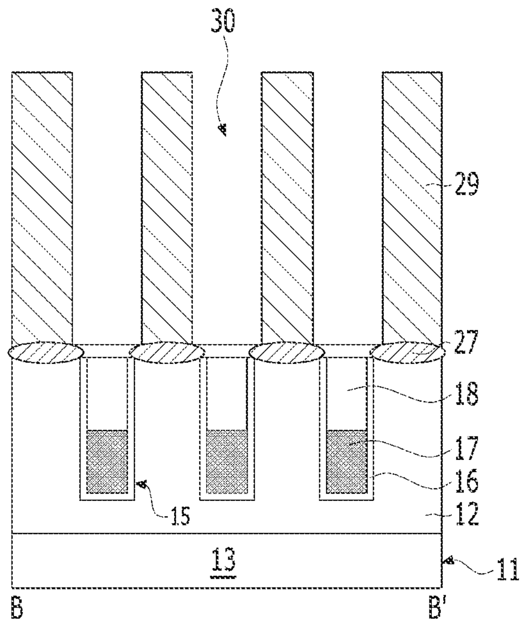

Referring to FIGS. 14A to 14C, a plug separation portion 30 may be formed. The plug separation portion 30 may define a first contact 29. The first contact 29 may be positioned over the contact pad 27 and may be electrically connected to the second source/drain region 20 through the contact pad 27. The plug separation portion 30 may separate the first contact 29 in the second direction D2.

Figure 15A:
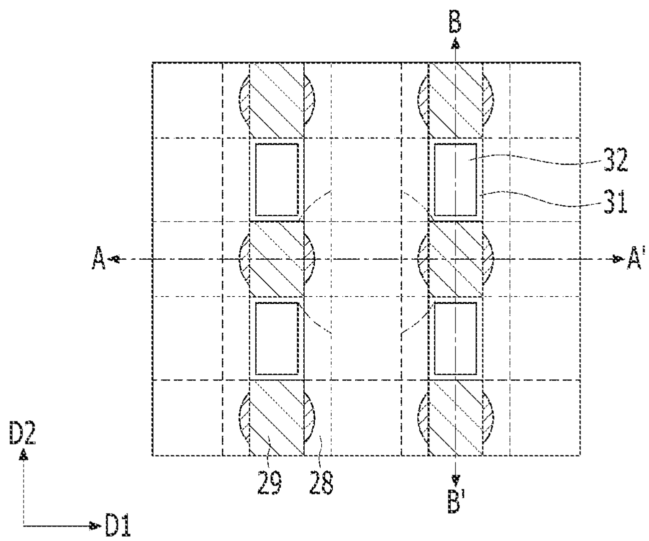
FIGS. 15A, 15B, and 15C illustrate a method for fabricating a semiconductor device in accordance with an embodiment of the present invention.
Figure 15B:
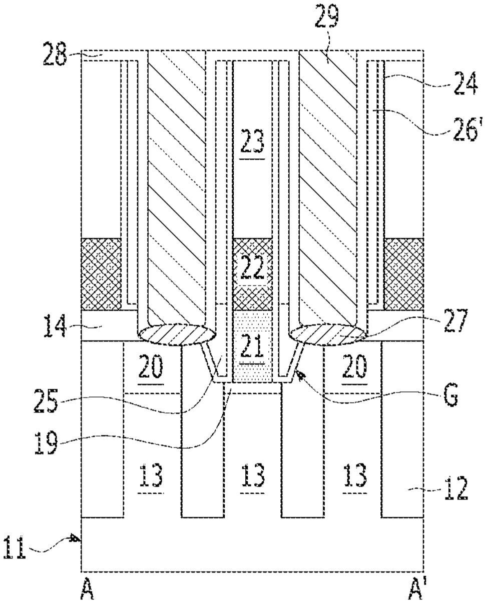
Figure 15C:
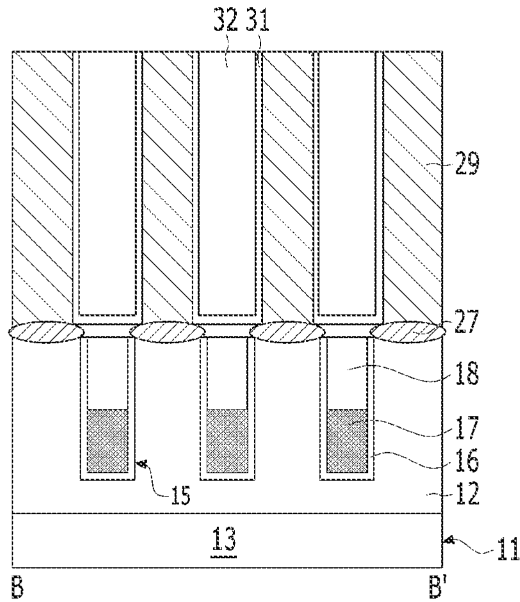

Referring to FIGS. 15A to 15C, first and second plug separation layers 31 and 32 may be sequentially formed in the plug separation portion 30. The first plug separation layer 31 may be conformally formed along the inner wall of the plug separation portion 30. The second plug separation layer 32 may be formed to fill the plug separation portion 30 over the first plug separation layer 31.

The first and second plug separation layers 31 and 32 may include a dielectric material. The first and second plug separation layers 31 and 32 may be formed of different materials. The first and second plug separation layers 31 and 32 may be formed of materials having different wet etch selectivities. The first plug separation layer 31 may be formed of a material having a wet etch selectivity which is similar to or the same as the wet etch selectivities of the first to third spacers 24, 26' and 28. For example, the first plug separation layer 31 may include silicon oxide. The second plug separation layer 32 may be formed of a material having a wet etch selectivity which is different from the wet etch selectivities of the first to third spacers 24, 26' and 28. For example, the second plug separation layer 32 may include silicon nitride.

Figure 16A:
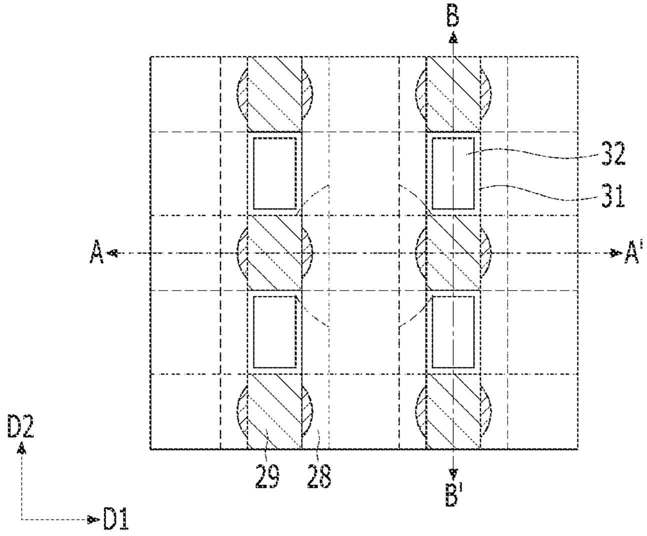
FIGS. 16A, 16B, and 16C illustrate a method for fabricating a semiconductor device in accordance with an embodiment of the present invention.
Figure 16B:
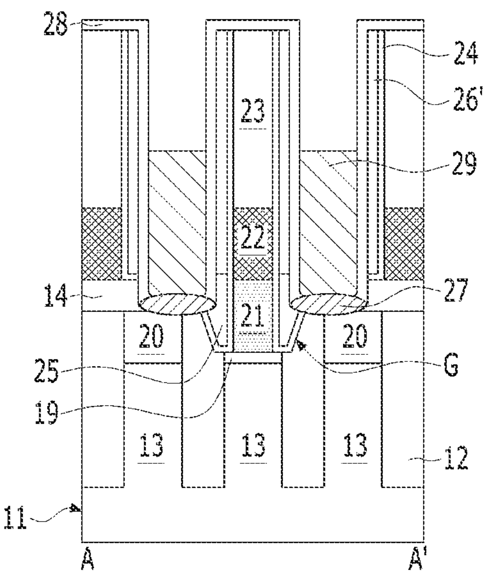
Figure 16C:
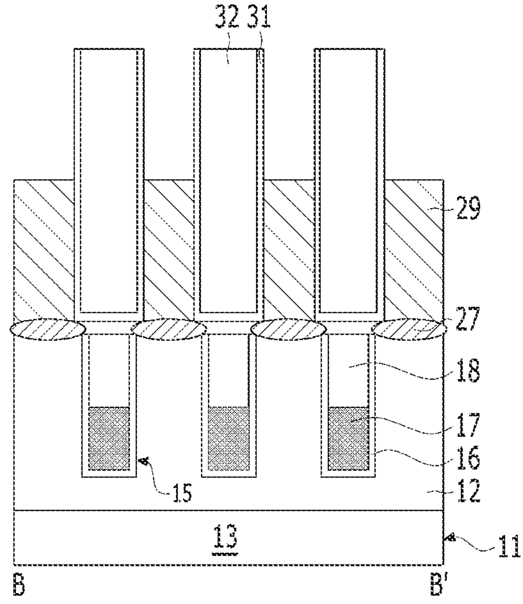

Referring to FIGS. 16A to 16C, the first contact 29 may be recessed. The first contact 29 may be recessed through an etch-back process. The upper surface of the recessed first contact 29 may be positioned at a higher level than the bottom surface of the bit line hard mask 23. According to another embodiment of the present invention, the upper surface of the recessed first contact 29 may be positioned at the same level as the upper surface of the bit line 22. In other words, the recessed first contact 29 may overlap with the bit line 22 in the lateral direction.

Figure 17A:
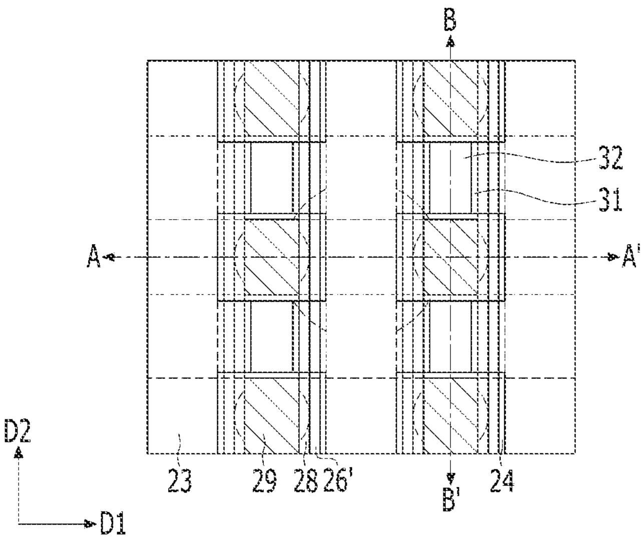
FIGS. 17A, 17B, and 17C illustrate a method for fabricating a semiconductor device in accordance with an embodiment of the present invention.
Figure 17B:
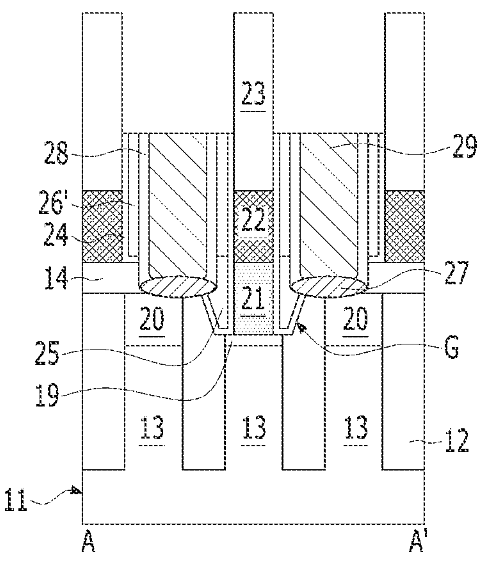
Figure 17C:
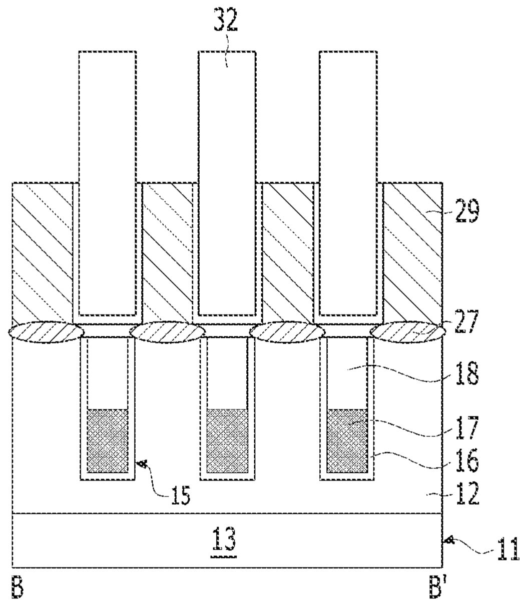

Referring to FIGS. 17A to 17C, the first to third spacers 24, 26', 28 and the first plug separation layer 31 exposed to the upper portion of the first contact 29 may be removed. To this end, the exposed third spacer 28 of a low-k material may be replaced with silicon oxide by performing an oxygen plasma stripping process. Subsequently, the exposed silicon oxide may be removed through a cleaning process using hydrofluoric acid (HF).

Accordingly, a spacer may not exist on the sidewall of the bit line structure protruding over the first contact 29. In other words, the bit line hard mask 23 and the second plug separation layer 32 may be exposed over the first contact 29.

The first to third spacers 24, 26' and 28 may be interposed between the bit line structure and the first contact 29. Accordingly, parasitic capacitance may be improved by applying a spacer structure having an Oxide/Oxide/Low-k material (O/O/K) structure between the bit line 22 and the first contact 29.

Figure 18A:
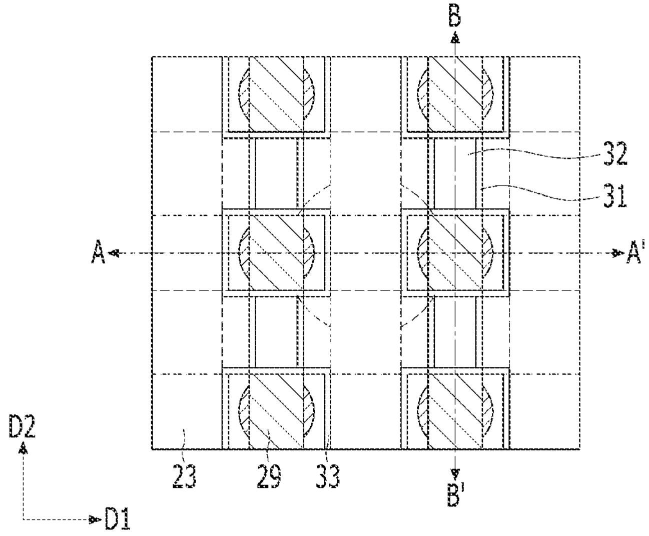
FIGS. 18A, 18B, and 18C illustrate a method for fabricating a semiconductor device in accordance with an embodiment of the present invention.
Figure 18B:
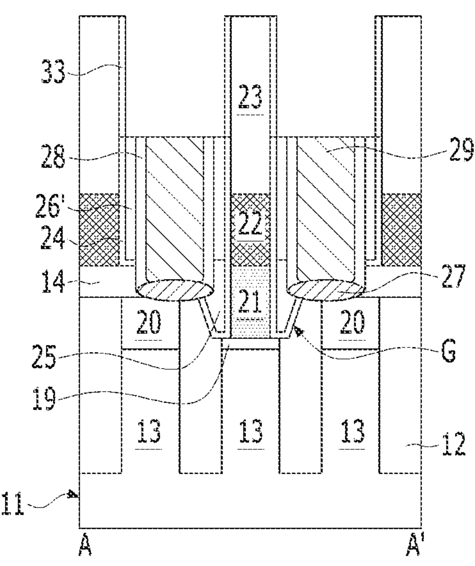
Figure 18C:
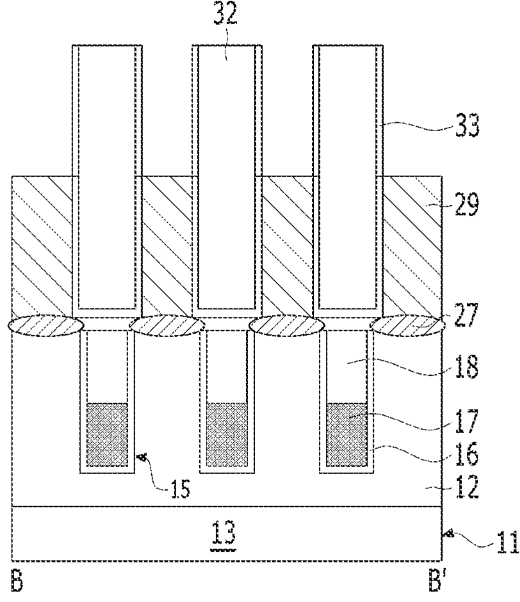

Referring to FIGS. 18A to 18C, a fourth spacer 33 may be formed on the sidewall of the exposed bit line hard mask 23 and the sidewall of the second plug separation layer 32. The fourth spacer 33 may include a dielectric material. For example, the fourth spacer 33 may include silicon nitride. The thickness of the fourth spacer 33 may be adjusted to be thinner than the total thicknesses of the first to third spacers 24, 26' and 28.

Figure 19A:
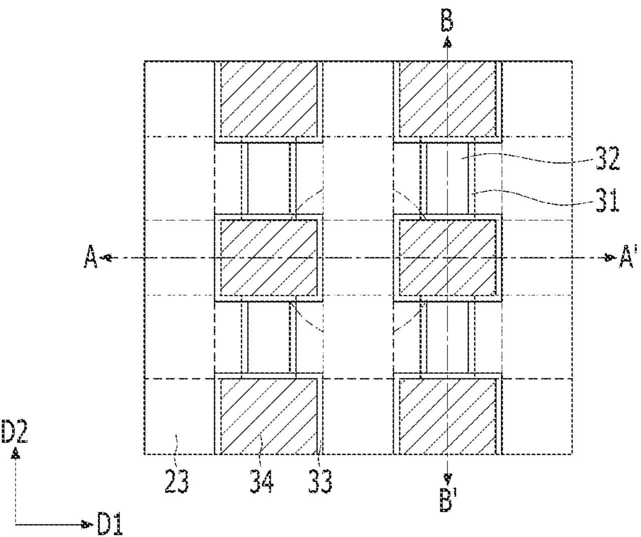
FIGS. 19A, 19B, and 19C illustrate a method for fabricating a semiconductor device in accordance with an embodiment of the present invention.
Figure 19B:
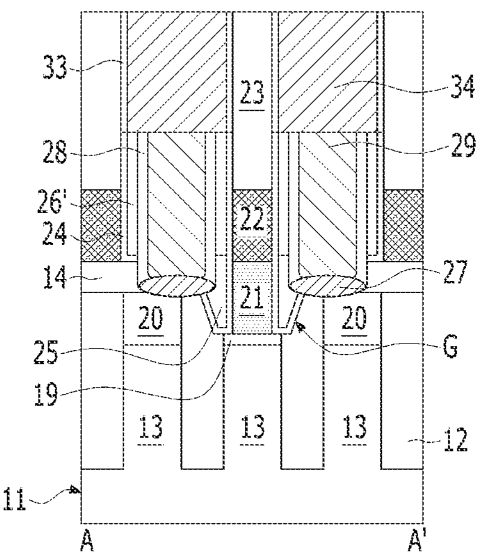
Figure 19C:
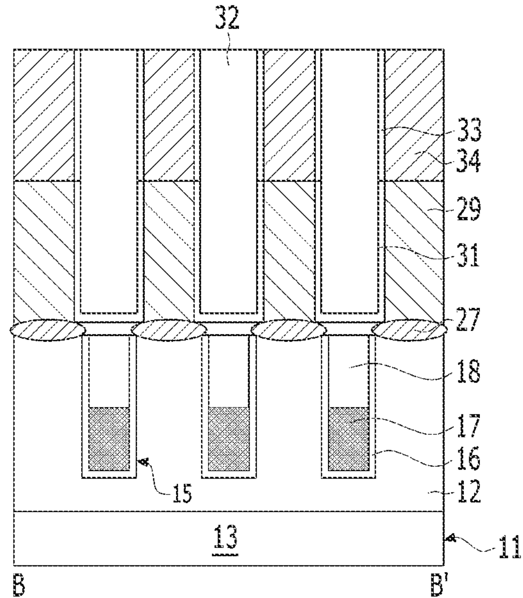

Referring to FIGS. 19A to 19C, a second contact 34 may be formed over the first contact 29. The second contact 34 may include a metal material.

The bottom surface of the second contact 34 may be positioned at a higher level than the upper surface of the bit line 22. The second contact 34 does not laterally overlap with the bit line 22. The second contact 34 may laterally overlap with the bit line hard mask 23.

According to an embodiment of the present invention, parasitic capacitance may be prevented by interposing the first to third spacers 24, 26' and 28 between the bit line 22 and the first contact 29. Also, the line width of the second contact 34 may be adjusted to be wider than the line width of the first contact 29 by interposing only the fourth spacer 33 whose thickness is smaller than the total thickness of the first to third spacers 24, 26', and 28 between the bit line hard mask 23 and the second contact 34. Accordingly, the overlap margin between the landing pad and the second contact 34 formed through the subsequent process may be improved.

Figure 20A:
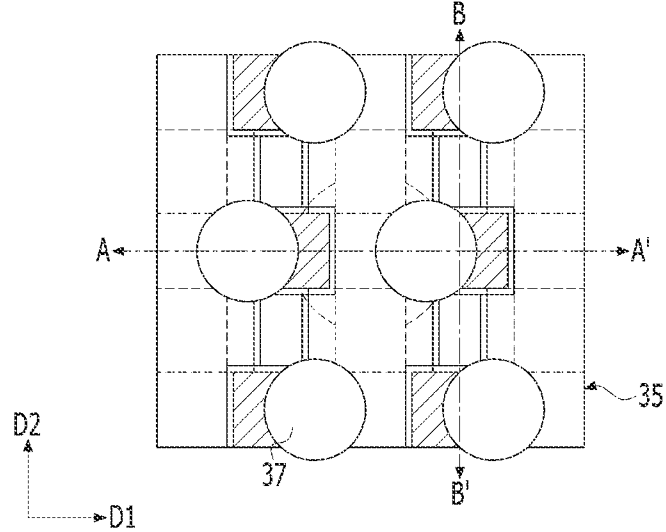
FIGS. 20A, 20B, and 20C illustrate a method for fabricating a semiconductor device in accordance with an embodiment of the present invention.
Figure 20B:
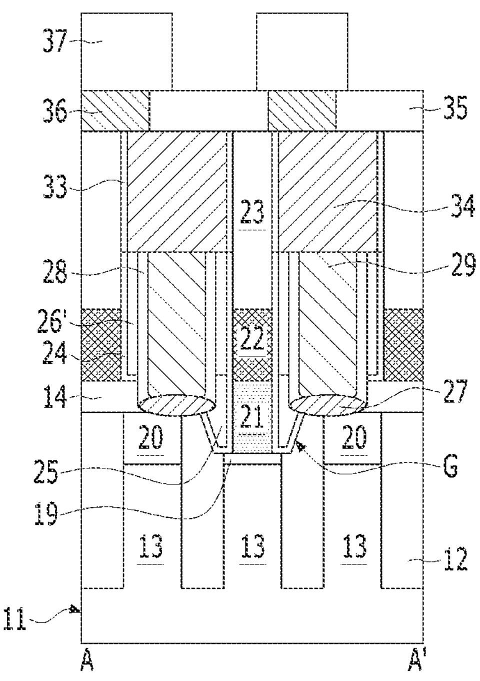
Figure 20C:
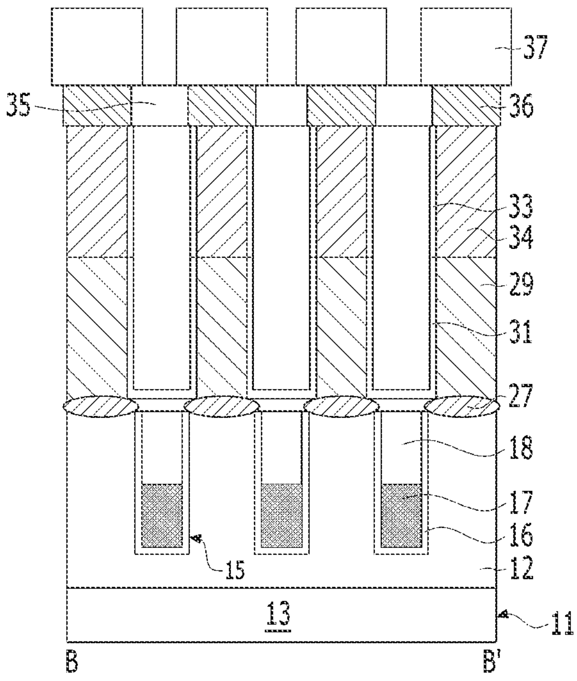

Referring to FIGS. 20A to 20C, a landing pad 36 may be formed over the second contact 34. The landing pad 36 may be spaced apart by an inter-layer dielectric layer 35. The landing pad 36 may be formed in an island shape when viewed from the perspective of a plan view.

Subsequently, a memory element 37 including a capacitor may be formed over the landing pad 36.

The memory element 37 may include a capacitor including a storage node. The storage node may include a pillar type. A dielectric layer and a plate node may be further formed over the storage node. The storage node may have a cylinder shape other than a pillar shape.

According to an embodiment of the present invention, it is possible to secure an overlap margin between a substrate and a contact by applying a contact pad.

According to an embodiment of the present invention, it is possible to prevent loss of a bit line spacer and to increase parasitic capacitance by reducing the dielectric constant.

According to an embodiment of the present invention, an overlap margin may be secured between a contact structure and a landing pad.

According to an embodiment of the present invention, it is possible to improve the reliability of a semiconductor device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:

a semiconductor substrate;

a plurality of bit line structures spaced apart from each other over the semiconductor substrate and each including a stacked structure of a bit line and a bit line hard mask;

a contact pad positioned over the semiconductor substrate between the neighboring bit line structures;

a contact structure including a stacked structure of a first contact formed over the contact pad and a second contact having a greater line width than the first contact;

a first spacer structure interposed between the first contact and each of the bit line structures, overlapping the bit line in a lateral direction, and having an O/O/K (oxide/oxide/low-k material) stacked structure; and a second spacer structure interposed between the second contact and each of the bit line structures, overlapping the bit line hard mask in the lateral direction, and comprising only one silicon nitride layer, wherein an upper surface of the first spacer structure is positioned at a same level as an upper surface of the first contact.

2. The semiconductor device of claim 1, wherein a thickness of the first spacer structure is greater than a thickness of the second spacer structure.

3. The semiconductor device of claim 1, wherein an upper surface of the first contact is positioned at a higher level than an upper surface of the bit line.

4. The semiconductor device of claim 1, wherein the contact pad includes an epitaxial layer.

5. The semiconductor device of claim 1, further comprising:

a buried gate structure formed in the semiconductor substrate; and first and second source/drain regions formed in the semiconductor substrate on both sides of the buried gate structure, wherein the contact pad is coupled to the second source/drain region.

6. The semiconductor device of claim 1, further comprising:

a bit line contact suitable for coupling the semiconductor substrate and each of the bit line structure.

7. The semiconductor device of claim 6, wherein an upper surface of the contact pad is positioned at a lower level than an upper surface of the bit line contact.

* * * * *